United States Patent
Kawakami et al.

(10) Patent No.: US 9,850,334 B2
(45) Date of Patent: Dec. 26, 2017

(54) MANUFACTURING METHOD OF POLYMER

(71) Applicant: TOYO GOSEI CO., LTD., Chiba (JP)

(72) Inventors: Yuki Kawakami, Chiba (JP); Michiya Naito, Chiba (JP); Takeshi Ikeya, Chiba (JP)

(73) Assignee: TOYO GOSEI CO., LTD., Chiba (JP)

( * ) Notice: Subject to any disclaimer, the term of this patent is extended or adjusted under 35 U.S.C. 154(b) by 0 days.

(21) Appl. No.: 15/303,581

(22) PCT Filed: Apr. 13, 2015

(86) PCT No.: PCT/JP2015/002043
§ 371 (c)(1),
(2) Date: Oct. 12, 2016

(87) PCT Pub. No.: WO2015/159530
PCT Pub. Date: Oct. 22, 2015

(65) Prior Publication Data
US 2017/0037169 A1    Feb. 9, 2017

Related U.S. Application Data

(60) Provisional application No. 61/979,463, filed on Apr. 14, 2014.

(51) Int. Cl.
| | | |
|---|---|---|
| *C08F 220/16* | (2006.01) | |
| *C08F 2/06* | (2006.01) | |
| *C08F 220/18* | (2006.01) | |
| *C09D 133/06* | (2006.01) | |
| *G03F 7/038* | (2006.01) | |
| *G03F 7/039* | (2006.01) | |
| *G03F 7/16* | (2006.01) | |

(52) U.S. Cl.
CPC .............. *C08F 220/16* (2013.01); *C08F 2/06* (2013.01); *C08F 220/18* (2013.01); *C09D 133/066* (2013.01); *G03F 7/038* (2013.01); *G03F 7/0397* (2013.01); *G03F 7/16* (2013.01)

(58) Field of Classification Search
CPC ........ C08F 2/06; C08F 220/16; C08F 220/18; C09D 133/066; G03F 7/038; G03F 7/0397; G03F 7/16
USPC ........................................................ 526/270
See application file for complete search history.

(56) References Cited

U.S. PATENT DOCUMENTS 4,764,572 A * 8/1988 Bean, Jr. ............... C08F 297/04
525/242
2010/0222526 A1* 9/2010 Oikawa ..................... C08F 2/00
526/60

FOREIGN PATENT DOCUMENTS

| WO | 2008053877 A1 | 5/2008 | |
|---|---|---|---|
| WO | WO 2008053877 | * 5/2008 | ............... C08F 2/00 |
| WO | 2015033960 A1 | 3/2015 | |

OTHER PUBLICATIONS

Kuntz et al. (The Copolymerization of 1,3-Butadiene with Styrene by Butyllithium Initiation, Journal of Polymer Science, vol. 54, pp. 569-586, 1961).*
International Search Report of corresponding application No. PCT/JP2015/002043 dated Jul. 14, 2015; 2 pgs.
Nozaki et al., "A Novel Polimer for a 193-nm Resist", Journal of Photopolymer Science and Technology, vol. 9 (1996), No. 3, pp. 509-522, 14 pgs.

* cited by examiner

*Primary Examiner* — Ling Choi
*Assistant Examiner* — Chun-Cheng Wang
(74) *Attorney, Agent, or Firm* — Maier & Maier, PLLC

(57) ABSTRACT

A method for manufacturing a polymer of which structure is exactly controlled is disclosed.

19 Claims, 1 Drawing Sheet

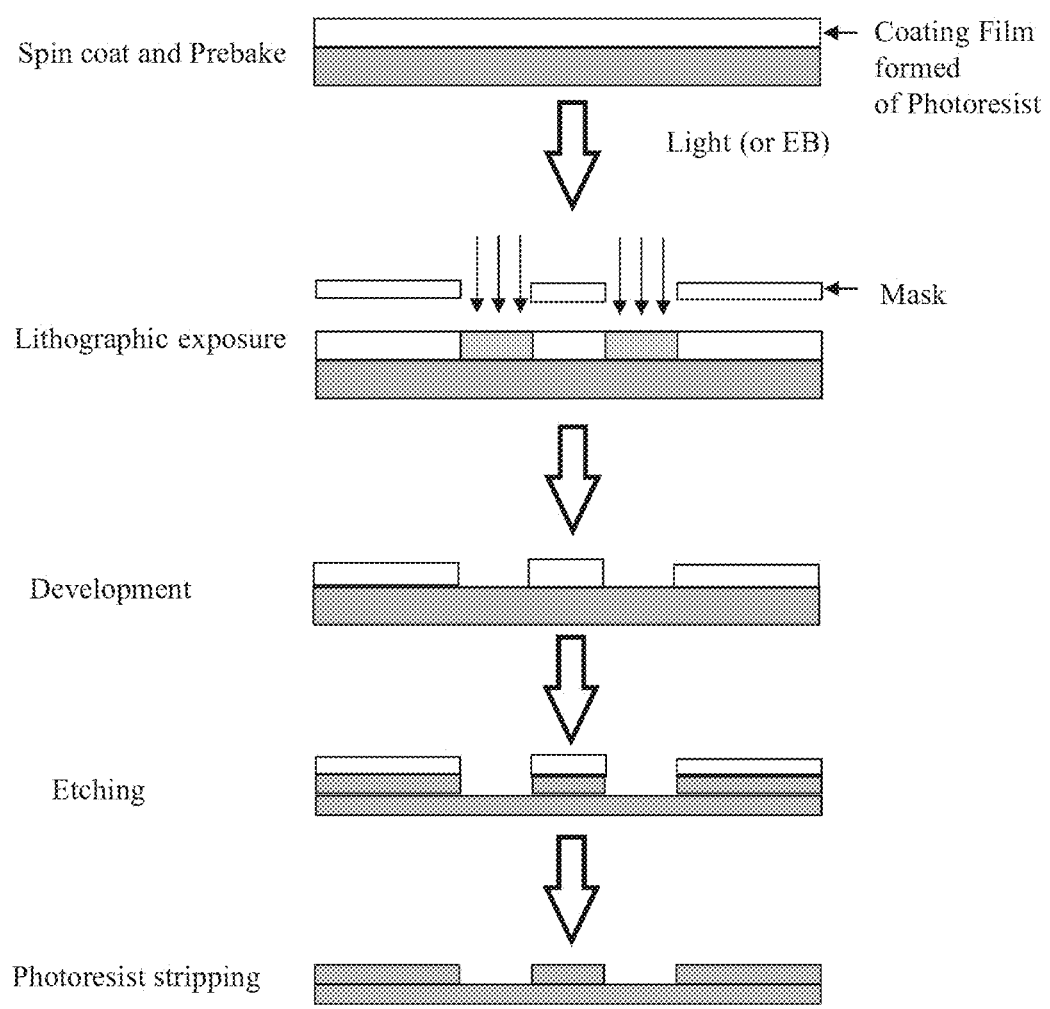

MANUFACTURING METHOD OF POLYMER

CROSS-REFERENCE TO RELATED APPLICATION

This application claims the benefit under 35 U.S.C. considered to be the best mode for carrying out the invention 61/979,463 filed on Apr. 14, 2014, the disclosure of which is hereby incorporated herein in its entirety by this reference.

TECHNICAL FIELD

Several aspects of the present invention relate to the fields of polymer, its manufacturing method and manufacturing method for components and devices.

BACKGROUND

Suppression of variability in molecular weight or ratio of units of polymers has been considered to be required for polymers to exhibit more excellent functionality. An purpose of an aspect of the present invention is to obtain polymers with small variability in molecular weight or ratio of units and method for manufacturing such polymer.

A resist polymer suitable for patterning using ArF laser is disclosed in Journal of Photopolymer Science and Technology, Vol. 9 (1996), No. 3, pp. 509-522.

BRIEF SUMMARY

In certain embodiments relating an aspect of the present invention, a method for manufacturing a polymer includes: placing a first liquid containing a first monomer in a reaction container; and adding a second liquid containing a second monomer to the first liquid or a third liquid containing the first monomer. It is preferred that the second monomer has polymerizability higher than the first monomer.

With regard to the method, it is preferred that the method further includes: adding a polymerization initiator to the first liquid to form the third liquid.

With regard to the method, it is preferred that an amounts of the polymerization initiator contained in the first liquid ranges from 1 wt % to 50 wt % of the total amount of the polymerization initiator to be used for manufacturing the polymer.

A method for manufacturing a polymer relating to another aspect of the present invention includes: placing a first liquid containing a polymerization initiator in a reaction container; and adding a second liquid containing a second monomer to the first liquid.

With regard to the method, it is preferred that the first liquid containing a first monomer.

With regard to the method, it is preferred that the polymerization initiator is added dropwise for 1 minute to 20 minutes to a first solvent which has been preliminarily heated to prepare the first liquid.

Typical examples of the first solvent are: ketones such as acetone, methyl ethyl ketone, methyl amyl ketone; ethers such as tetrahydrofuran, dioxane; and esters such as propylene glycol methyl ether acetate (PGMEA) and ethyl acetate.

With regard to the method, it is preferred that that a solution of the polymerization initiator or the polymerization initiator itself is added dropwise for 1 minute to 20 minutes to a first solvent to prepare the first liquid and the temperature of the first liquid is set for 1 minute to 30 minutes such that the temperature is stabilized within a predetermined temperature range after the addition of the polymerization initiator. Preferably, the temperature range is not allowed to fluctuate more than 2 degrees Celsius in either direction of a predetermined temperature.

With regard to the method, it is preferred that an amounts of the polymerization initiator contained in the first liquid ranges from 1 wt % to 50 wt % of the total amounts of the polymerization initiator to be used for manufacturing the polymer.

Typical examples of the first monomer mentioned above are monomers having a bulky substituent or a substituent on a carbon atom contained in a connection group of which main chain consists of at most two atoms. An example of such bulky substituent is a polycyclic group such as adamantyl group and norbornyl group. Concrete examples of the first monomer are 2-methyl-2-adamantyl(meth)acrylate, 2-ethyl-2-adamantyl(meth)acrylate, 1-(1-adamantyl)-1-methylethyl(meth)acrylate, 1-methylcyclohexyl(meth)acrylate, 1-ethylcyclohexyl(meth)acrylate, 1-methylcyclopentyl(meth)acrylate, 1-ethylcyclopentyl(meth)acrylate and isopropyl adamantyl(meth)acrylate.

It is preferred that the first monomer has a dissociable group by acid or is decomposed by acid.

It is preferred that an unit of the formed polymer derived from the first monomer is converted into an unit having carboxylic group by acid.

Monomers having hydrophilic group such as hydroxy group and cyano group can be used as the first monomer. It is preferred that monomers having hydroxy group can be preferably used because hydroxy group can improve adhesiveness of a polymer film formed of such monomer to substrate on which the polymer film is formed. Concrete examples of such monomer are (meth)acrylic acid, 2-hydroxyethyl(meth)acrylate, 3-hydroxypropyl(meth)acrylate, 2-hydroxy-n-propyl(meth)acrylate 4-hydroxybutyl(meth)acrylate, 3-hydroxy adamantyl(meth)acrylate, 2- or 3-cyano-5-norbornyl(meth)acrylate and 2-cyanomethyl-2-adamantyl(meth)acrylate.

Herein, (meth)acrylate, (meth)acryloyl and (meth)acryloyloxy mean methacrylate and acrylate, methacryloyl and acryloyl, and methacryloyloxy and acryloyloxy, respectively.

It is preferred that such monomer having such hydrophilic group is used as the second monomer.

A monomer having a lactone moiety can be used as the first monomer. Concrete examples are β-(meth)acryloyloxy-β-methyl-δ-valerolactone and 4,4-dimethyl-2-methylene-γ-butyrolactones, β-(meth)acryloyloxy-β-γ-butyrolactone, β-(meth)acryloyloxy-β-methyl-γ-butyrolactones.

It is preferred that such monomer having a lactone moiety is used as the second monomer.

A compound able to generating free radical, acid or base can be used as the polymerization initiator. Examples of such compound are azo compounds such as 2,2'-azobisisobutyronitrile, dimethyl-2,2-azobisisobutyrate, 2,2-azobis(2-(2-imidazoline-2-yl)propane).

Organic peroxides are also used as such polymerization initiator. Concrete examples of such organic peroxides are 2,5-dimethyl-2,5-di(tert-butylperoxy)hexane, di-(4-tert-butylcyclohexyl) peroxydicarbonate.

With regard to the method, it is preferred that the second liquid further contains the first monomer.

With regard to the method, it is preferred that the second liquid further contains a polymerization initiator.

With regard to the method, it is preferred that the method further includes: changing a temperature of the first liquid.

With regard to the method, it is preferred that the method further includes: terminating a polymerization reaction involved with at least the first monomer and the second monomer.

With regard to the method, it is preferred that the method further includes: first sampling a first portion of a reaction mixture placed in the reaction container.

With regard to the method, it is preferred that the method further includes: first checking at least one of molecular weight and ratio of units derived from the first monomer and the second monomer of polymers contained in the first portion.

It is preferred that at least one molecular weight and ratio of a first unit derived from the first monomer and to a second unit derived from the second monomer contained in the first portion.

With regard to the method, it is preferred that the method further includes: second sampling a second portion of a reaction mixture placed in the reaction container.

With regard to the method, it is preferred that the method further includes: second checking at least one of molecular weight and ratio of units derived from the first monomer and the second monomer of polymers contained in the second portion.

It is preferred that at least one molecular weight and ratio of a first unit of the formed polymer derived from the first monomer and to a second unit of the formed polymer derived from the second monomer contained in the second portion.

With regard to the method, it is preferred that the first sampling is carried out during the adding of the second liquid to the first liquid or a third liquid.

It is preferred that monomers having lactone moieties mentioned above is used as the second monomer.

With regard to the method, it is preferred that the first liquid further contains a third monomer.

With regard to the method, it is preferred that the second monomer has polymerizability higher than the third monomer. Alternatively, the third monomer has higher polymerizability compared to the second monomer.

With regard to the method, it is preferred that the second liquid further contains the third monomer.

With regard to the method, it is preferred that no polymerization initiator is added to the first liquid before the adding of the second liquid.

With regard to the method, it is preferred that no polymerization reaction occurs before the adding of the second liquid commences.

With regard to the method, it is preferred that the method further includes: providing a plurality of monomers for manufacturing the polymer. The plurality of monomers may include the first monomer and the second monomer; and the first monomer may have the lowest polymerizability among the plurality of monomers.

With regard to the method, it is preferred that the polymer includes units derived from all of the plurality of monomers.

With regard to the method, it is preferred that a difference between the molecular weight obtained by the first checking and the molecular weight obtained by the second checking is 15% at a maximum. It is more preferable that the difference is 7% at a maximum.

With regard to the method, it is preferred that a difference between the ratio of units obtained by the first checking and the ratio of units obtained by the second checking is 10% at a maximum. It is more preferable that the difference is 5% at a maximum.

The second checking may be carried out after termination of the polymerization reaction.

It is preferred that the second checking is carried out just before termination of the polymerization reaction.

A method for manufacturing a polymer relating to an aspect of the present invention includes: providing a first liquid containing a polymerization initiator in a reaction container; and adding a second liquid containing a first monomer and a second monomer.

With regard to the method, it is preferred that the method further includes: terminating a polymerization reaction involved with at least the first monomer and the second monomer; and first sampling a first portion of a reaction mixture placed in the reaction container. The first sampling may be carried out before the terminating of the polymerization reaction.

A method for manufacturing a polymer relating to an aspect of the present invention includes: a placing a first liquid containing a polymerization initiator; and adding a second liquid containing a first monomer to the first liquid and the polymerization initiator.

With regard to the method, it is preferred that the concentration is substantially constant during the adding of the second liquid.

With regard to the method, it is preferred that the quantity of the polymerization initiator in the first liquid is set such that the concentration is substantially constant during the adding of the second liquid.

With regard to the method, it is preferred that the quantity of the polymerization initiator in the second liquid is set such that the concentration is substantially constant during the adding of the second liquid.

With regard to the method, it is preferred that the quantity of the polymerization initiator in the first liquid is set based on a half-life period of the polymerization initiator.

With regard to the method, it is preferred that the quantity of the polymerization initiator in the second liquid is set based on a half-life period of the polymerization initiator.

A polymer relating to an aspect of the present invention by any one of the above methods.

A method for manufacturing a device relating to an aspect of the present invention is characterized by that the method is carried out using the polymer manufactured by any one of the above methods.

A method for manufacturing a device relating to an aspect of the present invention is characterized by that the method is carried out using photoresist containing the polymer manufactured by any one of the above methods.

BRIEF DESCRIPTION OF THE DRAWINGS

In the drawings, which illustrate what is currently considered to be the best mode for carrying out the invention:

FIG. 1 shows a fabrication process of an IC.

DETAILED DESCRIPTION

Experimental Procedures

The following monomers α-methacryloxy-γ-butyrolactone (m1), 2-methyl-2-adamantyl methacrylate (m2), 1,3-adamantanediol monomethacrylate (m3), 1-(1-adamantyl)-1-methylethyl methacrylate (m4) and 1-ethylcyclopentyl methacrylate (m5) are used for manufacturing polymers.

(m1)
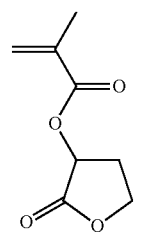

(m2)
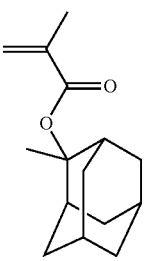

(m3)
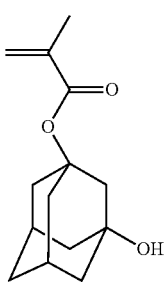

m4
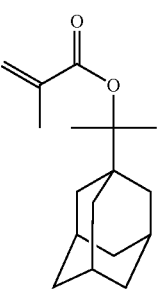

m5
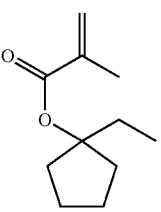

Experiment A

A solution containing 6.6 g of m2 and 47 g of propylene glycol methyl ether acetate (PGMEA) is prepared and placed in a flask. The PGMEA solution placed in the flask is warmed to 80 degrees Celsius in a nitrogen atmosphere. 2.15 g of 2,2'-azobis(2.4-dimethyl)valeronitrile as a polymerization initiator solved in 5 g of PGMEA is added to the PGMEA solution for 10 minutes. After the addition of the polymerization initiator, the temperature of the PGMEA solution containing the polymerization initiator is stabilized at 80.5 degrees Celsius. And then, a mixture containing 95.0 g of m1, 125.0 g of m2 and 66.0 g of m3, 6.02 g of 2,2'-azobis(2.4-dimethyl) valeronitrile and 300 g of PGMEA is added to the PGMEA solution over 4 hours with stirring at 80 degrees Celsius.

The monomer m2 has the lowest polymerizability compared to monomer m1 because m2 has a bulky substituent like polycyclic group or a substituent like methyl group on a carbon atom which is contained in adamantyl group and connected to a polymerizable group like acryloyl or methacryloyl group through connecting group of which main chain consists of at most two atoms. During the addition of the mixture to the PGMEA solution, portions each of which quantity is 6.0 g are sampled from the reaction mixture placed in the flask after 1 hour, 2 hours, 4 hours and 6 hours from the start of the addition. When the sampling 6 hours from the start of the addition is carried out, the addition is completed. Polymer is obtained as powder by reprecipitation which is carried out by drop of each of the sampled portions into 55 g of isopropyl alcohol.

The weight-average molecular weights (Mw) and dispersivities (Mw/Mn) of polymers obtained from the portions are estimated by gel permeation chromatography (GPC). Ratios of unit formed from m1 (U1), unit formed from m2 (U2) and unit formed from m3 (U3) are estimated $^1$H NMR.

Table 1 shows the weight-average molecular weights (Mw), dispersivities (Mw/Mn) and ratios of the units (U1, U2 and U3) of the polymers obtained after 1 hour, 2 hours, 4 hours and 6 hours from the start of the addition in Experiment A.

Table 1: the weight-average molecular weights (Mw), dispersivities (Mw/Mn) and ratios of the units of the polymers obtained after 1 hour, 2 hours, 4 hours and 6 hours from the start of the addition in Experiment A

TABLE 1

| Time | Weight-average molecular weights Mw | Dispersivities Mw/Mn | Ratio of Units (mol/%) | | |
|---|---|---|---|---|---|
| | | | U1 | U2 | U3 |
| 1 h | 9300 | 1.58 | 43 | 38 | 19 |
| 2 h | 9500 | 1.64 | 41 | 38 | 21 |
| 4 h | 9800 | 1.66 | 40 | 39 | 21 |
| 6 h | 10000 | 1.68 | 40 | 40 | 20 |

Experiment B

A solution containing 6.6 g of m2, 1.2 g of m3 and 47 g of propylene glycol methyl ether acetate (PGMEA) is prepared and placed in a flask. The PGMEA solution placed in the flask is warmed to 80 degrees Celsius in a nitrogen atmosphere. After 2.15 g of 2,2'-azobis(2.4-dimethyl) valeronitrile solved in 5 g of PGMEA is added to the PGMEA solution, a mixture containing 95.0 g of m1, 125.0 g of m2 and 66.0 g of m3, 6.02 g of 2,2'-azobis(2.4-dimethyl) valeronitrile and 300 g of PGMEA is added to the PGMEA solution over 4 hours with stirring at 80 degrees Celsius. During the addition of the mixture to the PGMEA solution, portions each of which quantity is 6.0 g are sampled from the reaction mixture placed in the flask after 1 hour, 2 hours, 4 hours and 6 hours from the start of the addition. Polymer is obtained as powder by reprecipitation which is carried out by drop of each of the sampled portions into 55 g of isopropyl alcohol.

The weight-average molecular weights (Mw) and dispersivities (Mw/Mn) of polymers obtained from the portions are estimated by gel permeation chromatography (GPC).

Ratios of unit formed from m1 (U1), unit formed from m2 (U2) and unit formed from m3 (U3) are estimated $^1$H NMR.

Table 2 shows the weight-average molecular weights (Mw), dispersivities (Mw/Mn) and ratios of the units (U1, U2 and U3) of the polymers obtained after 1 hour, 2 hours, 4 hours and 6 hours from the start of the addition in Experiment B.

Table 2: the weight-average molecular weights (Mw), dispersivities (Mw/Mn) and ratios of the units of the polymers obtained after 1 hour, 2 hours, 4 hours and 6 hours from the start of the addition in Experiment B

TABLE 2

| Time | Weight-average molecular weights Mw | Dispersivities Mw/Mn | Ratio of Units (mol/%) | | |
|---|---|---|---|---|---|
| | | | U1 | U2 | U3 |
| 1 h | 8500 | 1.58 | 45 | 35 | 20 |
| 2 h | 9300 | 1.60 | 43 | 37 | 20 |
| 4 h | 9900 | 1.63 | 41 | 39 | 20 |
| 6 h | 10000 | 1.66 | 40 | 40 | 20 |

Experiment C 47 g of propylene glycol methyl ether acetate (PGMEA) is prepared and placed in a flask. The PGMEA placed in the flask is warmed to 80 degrees Celsius in a nitrogen atmosphere. After 2.15 g of 2,2'-azobis(2.4-dimethyl) valeronitrile solved in 5 g of PGMEA is added to the PGMEA, a mixture containing 95.0 g of m1, 133.0 g of m2 and 66.0 g of m3, 6.02 g of 2,2'-azobis(2.4-dimethyl) valeronitrile and 300 g of PGMEA is added to the PGMEA solution containing 2.15 g of 2,2'-azobis(2.4-dimethyl) valeronitrile over 4 hours with stirring at 80 degrees Celsius. During the addition of the mixture to the PGMEA solution of 2,2'-azobis(2.4-dimethyl) valeronitrile, portions each of which quantity is 6.0 g are sampled from the reaction mixture placed in the flask after 1 hour, 2 hours, 4 hours and 6 hours from the start of the addition. Polymer is obtained as powder by reprecipitation which is carried out by drop of each of the sampled portions into 55 g of isopropyl alcohol.

The weight-average molecular weights (Mw) and dispersivities (Mw/Mn) of polymers obtained from the portions are estimated by gel permeation chromatography (GPC). Ratios of unit formed from m1 (U1), unit formed from m2 (U2) and unit formed from m3 (U3) are estimated $^1$H NMR.

Table 3 shows the weight-average molecular weights (Mw), dispersivities (Mw/Mn) and ratios of the units (U1, U2 and U3) of the polymers obtained after 1 hour, 2 hours, 4 hours and 6 hours from the start of the addition in Experiment C.

Table 3: the weight-average molecular weights (Mw), dispersivities (Mw/Mn) and ratios of the units of the polymers obtained after 1 hour, 2 hours, 4 hours and 6 hours from the start of the addition in Experiment C

TABLE 3

| Time | Weight-average molecular weights Mw | Dispersivities Mw/Mn | Ratio of Units (mol/%) | | |
|---|---|---|---|---|---|
| | | | U1 | U2 | U3 |
| 1 h | 9000 | 1.58 | 49 | 34 | 17 |
| 2 h | 9500 | 1.60 | 44 | 36 | 20 |
| 4 h | 9800 | 1.61 | 43 | 40 | 17 |
| 6 h | 10000 | 1.69 | 40 | 40 | 20 |

Experiment D

A solution containing 13.3 g of m2 and 47 g of propylene glycol methyl ether acetate (PGMEA) is prepared and placed in a flask. The PGMEA solution placed in the flask is warmed to 80 degrees Celsius in a nitrogen atmosphere. A mixture containing 95.0 g of m1, 113.4 g of m2 and 66.0 g of m3, 8.66 g of 2,2'-azobis(2.4-dimethyl) valeronitrile and 300 g of PGMEA is added to the PGMEA solution over 4 hours with stirring at 80 degrees Celsius. During the addition of the mixture to the PGMEA solution of 2,2'-azobis(2.4-dimethyl) valeronitrile, portions each of which quantity is 6.0 g are sampled from the reaction mixture placed in the flask after 1 hour, 2 hours, 4 hours and 6 hours from the start of the addition. Polymer is obtained as powder by reprecipitation which is carried out by drop of each of the sampled portions into 55 g of isopropyl alcohol.

The weight-average molecular weights (Mw) and dispersivities (Mw/Mn) of polymers obtained from the portions are estimated by gel permeation chromatography (GPC). Ratios of unit formed from m1 (U1), unit formed from m2 (U2) and unit formed from m3 (U3) are estimated $^1$H NMR.

Table 4: the weight-average molecular weights (Mw), dispersivities (Mw/Mn) and ratios of the units of the polymers obtained after 1 hour, 2 hours, 4 hours and 6 hours from the start of the addition in Experiment D

TABLE 4

| Time | Weight-average molecular weights Mw | Dispersivities Mw/Mn | Ratio of Units (mol/%) | | |
|---|---|---|---|---|---|
| | | | U1 | U2 | U3 |
| 1 h | 13000 | 1.75 | 37 | 52 | 11 |
| 2 h | 12000 | 1.74 | 40 | 49 | 11 |
| 4 h | 11000 | 1.73 | 41 | 45 | 16 |
| 6 h | 10000 | 1.71 | 40 | 40 | 20 |

Table 4 shows the weight-average molecular weights (Mw), dispersivities (Mw/Mn) and ratios of the units (U1, U2 and U3) of the polymers obtained after 1 hour, 2 hours, 4 hours and 6 hours from the start of the addition in Experiment D.

Experiment E 47 g of propylene glycol methyl ether acetate (PGMEA) is prepared and placed in a flask. A mixture containing 95.0 g of m1, 133.0 g of m2 and 66.0 g of m3, 8.66 g of 2,2'-azobis(2.4-dimethyl) valeronitrile and 300 g of PGMEA is added to the PGMEA over 4 hours with stirring at 80 degrees Celsius. During the addition of the mixture to the PGMEA, portions each of which quantity is 6.0 g are sampled from the reaction mixture placed in the flask after 1 hour, 2 hours, 4 hours and 6 hours from the start of the addition. Polymer is obtained as powder by reprecipitation which is carried by drop of each of the sampled portions into 55 g of isopropyl alcohol.

The weight-average molecular weights (Mw) and dispersivities (Mw/Mn) of polymers obtained from the portions are estimated by gel permeation chromatography (GPC). Ratios of unit formed from m1 (U1), unit formed from m2 (U2) and unit formed from m3 (U3) are estimated $^1$H NMR.

Table 5: the weight-average molecular weights (Mw), dispersivities (Mw/Mn) and ratios of the units of the polymers obtained after 1 hour, 2 hours, 4 hours and 6 hours from the start of the addition in Experiment E

TABLE 5

| Time | Weight-average molecular weights Mw | Dispersivities Mw/Mn | Ratio of Units (mol/%) | | |
|---|---|---|---|---|---|
| | | | U1 | U2 | U3 |
| 1 h | 15000 | 1.71 | 56 | 25 | 19 |
| 2 h | 13000 | 1.61 | 53 | 29 | 18 |
| 4 h | 11000 | 1.62 | 46 | 33 | 21 |
| 6 h | 10000 | 1.70 | 40 | 40 | 20 |

Table 5 shows the weight-average molecular weights (Mw), dispersivities (Mw/Mn) and ratios of the units (U1, U2 and U3) of the polymers obtained after 1 hour, 2 hours, 4 hours and 6 hours from the start of the addition in Experiment E.

Experiment F

A solution containing 7.4 g of m4 and 47 g of propylene glycol methyl ether acetate (PGMEA) is prepared and placed in a flask. The PGMEA solution placed in the flask is warmed to 80 degrees Celsius in a nitrogen atmosphere. 2.40 g of 2,2'-azobis(2.4-dimethyl) valeronitrile as a polymerization initiator solved in 5 g of PGMEA is added to the PGMEA solution for 10 minutes. After the addition of the polymerization initiator, the PGMEA solution containing the polymerization initiator is warmed and the temperature of the solution is stabilized at 80.5 degrees Celsius. And then, a mixture containing 95.0 g of m1, 140.1 g of m4 and 66.0 g of m3, 6.74 g of 2,2'-azobis(2.4-dimethyl) valeronitrile and 300 g of PGMEA is added to the PGMEA solution over 4 hours with stirring at 80 degrees Celsius. The monomer m4 has the lowest polymerizability among the monomers m1, m4 and n13 because m4 has a bulky substituent like adamantyl group and a substituent like methyl group on a carbon atom which is contained in such bulky group and which is connected to a acryloyl group through an oxygen atom. During the addition of the mixture to the PGMEA solution, portions each of which quantity is 6.0 g are sampled from the reaction mixture placed in the flask after 1 hour, 2 hours, 4 hours and 6 hours from the start of the addition. Polymer is obtained as powder by reprecipitation which is carried out by drop of each of the sampled portions into 55 g of isopropyl alcohol.

The weight-average molecular weights (Mw) and dispersivities (Mw/Mn) of polymers obtained from the portions are estimated by gel permeation chromatography (GPC). Ratios of unit formed from m1 (U1), unit formed from m4 (U4) and unit formed from m3 (U3) are estimated $^1$H NMR.

Table 6 shows the weight-average molecular weights (Mw), dispersivities (Mw/Mn) and ratios of the units (U1, U4 and U3) of the polymers obtained after 1 hour, 2 hours, 4 hours and 6 hours from the start of the addition in Experiment F.

Table 6: the weight-average molecular weights (Mw), dispersivities (Mw/Mn) and ratios of the units of the polymers obtained after 1 hour, 2 hours, 4 hours and 6 hours from the start of the addition in Experiment F

TABLE 6

| Time | Weight-average molecular weights Mw | Dispersivities Mw/Mn | Ratio of Units (mol/%) | | |
|---|---|---|---|---|---|
| | | | U1 | U4 | U3 |
| 1 h | 8400 | 1.69 | 42 | 40 | 18 |
| 2 h | 8600 | 1.73 | 41 | 40 | 19 |

TABLE 6-continued

| Time | Weight-average molecular weights Mw | Dispersivities Mw/Mn | Ratio of Units (mol/%) | | |
|---|---|---|---|---|---|
| | | | U1 | U4 | U3 |
| 4 h | 8800 | 1.76 | 40 | 39 | 21 |
| 6 h | 9000 | 1.78 | 39 | 40 | 21 |

Experiment G

A solution containing 5.1 g of m5 and 47 g of propylene glycol methyl ether acetate (PGMEA) is prepared and placed in a flask. The PGMEA solution placed in the flask is warmed to 80 degrees Celsius in a nitrogen atmosphere. 1.66 g of 2,2'-azobis(2.4-dimethyl) valeronitrile as a polymerization initiator solved in 5 g of PGMEA is added to the PGMEA solution for 10 minutes. After the addition of the polymerization initiator, the temperature of the PGMEA solution containing the polymerization initiator is stabilized at 80.5 degrees Celsius. And then, a mixture containing 95.0 g of m1, 96.6 g of m5 and 66.0 g of m3, 4.65 g of 2,2'-azobis(2.4-dimethyl) valeronitrile and 300 g of PGMEA is added to the PGMEA solution over 4 hours with stirring at 80 degrees Celsius. The monomer m5 has the lowest polymerizability among the monomers m1, m5 and m3 because m5 has a substituent like ethyl group on a carbon atom which is contained in a cyclic group and which is connected to a polymerizable group like acryloyl group through a connecting group like an oxygen atom. During the addition of the mixture to the PGMEA solution, portions each of which quantity is 6.0 g are sampled from the reaction mixture placed in the flask after 1 hour, 2 hours, 4 hours and 6 hours from the start of the addition. Polymer is obtained as powder by reprecipitation which is carried out by drop of each of the sampled portions into 55 g of isopropyl alcohol.

The weight-average molecular weights (Mw) and dispersivities (Mw/Mn) of polymers obtained from the portions are estimated by gel permeation chromatography (GPC). Ratios of unit formed from m1 (U1), unit formed from m5 (U5) and unit formed from m3 (U3) are estimated $^1$H NMR.

Table 7 shows the weight-average molecular weights (Mw), dispersivities (Mw/Mn) and ratios of the units (U1, U5 and U3) of the polymers obtained after 1 hour, 2 hours, 4 hours and 6 hours from the start of the addition in Experiment G. Table 7: the weight-average molecular weights (Mw), dispersivities (Mw/Mn) and ratios of the units of the polymers obtained after 1 hour, 2 hours, 4 hours and 6 hours from the start of the addition in Experiment G

TABLE 7

| Time | Weight-average molecular weights Mw | Dispersivities Mw/Mn | Ratio of Units (mol/%) | | |
|---|---|---|---|---|---|
| | | | U1 | U5 | U3 |
| 1 h | 8300 | 1.67 | 41 | 40 | 19 |
| 2 h | 8500 | 1.69 | 42 | 40 | 18 |
| 4 h | 8800 | 1.73 | 40 | 39 | 21 |
| 6 h | 9000 | 1.75 | 40 | 40 | 20 |

Experiment H

A solution containing 6.6 g of m1 and 47 g of propylene glycol methyl ether acetate (PGMEA) is prepared and placed in a flask. The PGMEA solution placed in the flask is warmed to 80 degrees Celsius in a nitrogen atmosphere. 2.15 g of 2,2'-azobis(2.4-dimethyl) valeronitrile as a polymerization initiator solved in 5 g of PGMEA is added to the PGMEA solution dropwise for 10 minutes. After the addition of the polymerization initiator, the temperature of the PGMEA solution containing the polymerization initiator is stabilized at 80.5 degrees Celsius. And then, a mixture containing 89.4 g of m1, 125.0 g of m3 and 66.0 g of m2, 6.02 g of 2,2'-azobis(2.4-dimethyl) valeronitrile and 300 g of PGMEA is added to the PGMEA solution over 4 hours with stirring at 80 degrees Celsius. The monomer m1 has relatively high polymerizability compared to m2 and m3 because m1 do not have a bulky substituent. During the addition of the mixture to the PGMEA solution, portions each of which quantity is 6.0 g are sampled from the reaction mixture placed in the flask after 1 hour, 2 hours, 4 hours and 6 hours from the start of the addition. Polymer is obtained as powder by reprecipitation which is carried out by drop of each of the sampled portions into 55 g of isopropyl alcohol.

The weight-average molecular weights (Mw) and dispersivities (Mw/Mn) of polymers obtained from the portions are estimated by gel permeation chromatography (GPC). Ratios of unit formed from m1 (U1), unit formed from m2 (U2) and unit formed from m3 (U3) are estimated $^1$H NMR.

Table 8 shows the weight-average molecular weights (Mw), dispersivities (Mw/Mn) and ratios of the units (U1, U2 and U3) of the polymers obtained after 1 hour, 2 hours, 4 hours and 6 hours from the start of the addition in Experiment A.

Table 8: the weight-average molecular weights (Mw), dispersivities (Mw/Mn) and ratios of the units of the polymers obtained after 1 hour, 2 hours, 4 hours and 4 hours from the start of the addition in Experiment H

TABLE 8

| | Weight-average molecular weights | Dispersivities | Ratio of Units (mol/%) | | |
|---|---|---|---|---|---|
| Time | Mw | Mw/Mn | U1 | U2 | U3 |
| 1 h | 10000 | 1.76 | 60 | 15 | 25 |
| 2 h | 10500 | 1.73 | 50 | 30 | 20 |
| 4 h | 10800 | 1.72 | 45 | 35 | 20 |
| 6 h | 11000 | 1.71 | 40 | 39 | 21 |

Evaluation of Dissolution Rate

Preparation of 12.5 wt % solutions of polymers obtained in the above experiments is attempted by dissolving the polymers in PGMEA. Film is not formed of polymer obtained in Experiment E because the polymer is not dissolved in PGMEA. Although polymers obtained in Experiments C and D are not completely dissolved in PGMEA, solutions of polymers obtained in experiments other than Experiment E can be prepared. After filtration of the solutions by polytetrafluoroethylene (PTFE) filter, the solutions are applied to 4-inch silicon wafers by a spin coater to form coating films. The coating films are baked at 90 degrees Celsius for 1 minute. The thickness of the baked coating films are around 400 nm. Developments experiments of the baked coating films are carried out by soaking them in butyl acetate. Dissolution rates are estimated by reduction of the thickness of the baked film by the developments experiments.

Table 9 shows maximum changes (%) in the weight-average molecular weights (Mw), maximum changes (%) in the ratios of units of polymers obtained by sampling after 1 hour, 2 hours, 4 hours and 6 hours from the start of the reactions. Table 9 also shows the solubility of polymers obtained by sampling after 1 hour from the start of the reactions, homogeneousness of coating film of polymers by after 6 hours from the start of the reactions.

Table 9: Maximum changes (%) in the weight-average molecular weights (Mw) and maximum changes (%) in the ratios of units of polymers obtained by sampling, the solubility of polymers in PGMEA solutions containing 30% of the polymers, homogeneousness of coating film of polymers formed by spin-coating of PGMEA solutions containing 30% of the polymers obtained after 6 hours from the start of the reactions and dissolution rate

TABLE 9

| | Maximum change in Mw (%) | Maximum change in the ratio of units (%) | Solubility | Homogeneousness of coating film | Dissolution rate |
|---|---|---|---|---|---|
| Experiment A | 7 | 3 | Good | Even | 25 nm/sec |
| Experiment B | 15 | 5 | Good | Not even | 20 nm/sec |
| Experiment C | 10 | 9 | Slightly suspended | Even | 15 nm/sec |
| Experiment D | 30 | 12 | Slightly suspended | Not even | 15 nm/sec |
| Experiment E | 50 | 16 | Suspended | Film is not formed | 13 nm/sec |
| Experiment F | 7 | 2 | Good | Even | 25 nm/sec |
| Experiment G | 7 | 2 | Good | Even | 30 nm/sec |
| Experiment H | 10 | 20 | Slightly suspended | Not even | 14 nm/sec |

As shown in Table 9, the polymers of which maximum changes in the weight-average molecular weights (Mw) are equal to or smaller than 15% tend to excel in solubility and dissolution rate. The polymers of which maximum changes in the weight-average molecular weights (Mw) are equal to or smaller than 7% tend to excel in both solubility and film formation. The polymers of which maximum change in the ratio of units are equal to or smaller than 6% tend to excel in solubility. The polymers of which maximum changes in the ratio of units are equal to or smaller than 3% tend to excel in both solubility and film formation.

FIG. 1 shows fabrication processes of a device such as integrated circuit (IC) and electro-optical device using a chemically-amplified composition (CAR) photoresist containing any one of polymers obtained by any one of Experiments A, B, F and G, phenyl dibenzothionium nonafluorobutanesulfonate (PBpS-PFBS) as photoacid generator.

A silicon wafer is provided. The surface of the silicon wafer is oxidized by heating the silicon wafer in the presence of molecular oxygen.

A solution of the CAR photoresist is applied to the surface of the silicon wafer by spin coating to form a coating film. The coating film is prebaked.

An irradiation of the coating film with a light through a mask is carried out after prebake of the silicon wafer. Typical examples of the light for the irradiation are EUV light, light from an ArF laser or a KrF laser, i-line and g-line.

After the irradiation of the coating film, prebake is carried out. Development of the coating film which has been irradiated with the light after the prebake.

The coating film and the silicon wafer are exposed to plasma. After that, the remaining film is removed.

An electronic device such as integrated circuit is fabricated utilizing the processes shown in FIG. 1.

Instead of the irradiation with the light in the above process, an exposure of the coating film to electron beam (EB) can also be carried out

What is claimed is:

1. A method for manufacturing a polymer, the method comprising:
    placing a first liquid containing a first monomer having a dissolved group by acid in a reaction container;
    adding a radical polymerization initiator to the first liquid to form a third liquid; and
    adding a second liquid containing a second monomer to the third liquid,
    wherein the second monomer has polymerizablity higher than the first monomer, and
    the second liquid contains all of the second monomer.

2. The method of claim 1,
    wherein the second liquid further contains the first monomer.

3. The method of claim 1,
    wherein the second liquid further contains a radical polymerization initiator.

4. The method of claim 1, further comprising: changing a temperature of the first liquid.

5. The method of claim 1, further comprising: terminating a polymerization reaction involved with at least the first monomer and the second monomer.

6. The method of claim 1, further comprising: first sampling a first portion of a reaction mixture placed in the reaction container.

7. The method of claim 6, further comprising: first checking at least one of molecular weight and ratio of units derived from the first monomer and the second monomer of polymers contained in the first portion.

8. The method of claim 6, further comprising: second sampling a second portion of a reaction mixture placed in the reaction container.

9. The method of claim 8, further comprising: second checking at least one of molecular weight and ratio of units derived from the first monomer and the second monomer of polymers contained in the second portion.

10. The method of claim 6,
    wherein the first sampling is carried out during the adding of the second liquid to the third liquid.

11. The method of claim 1,
    wherein the first liquid further contains a third monomer.

12. The method of claim 11,
    wherein the second monomer has polymerizablity higher than the third monomer.

13. The method of claim 11,
    wherein the second liquid further contains the third monomer.

14. The method of claim 1,
    wherein no polymerization reaction occurs before the adding of the second liquid commences.

15. The method of claim 11,
    wherein: the first monomer has the lowest polymerizablity among all monomers.

16. The method of claim 15,
    wherein the polymer includes units derived from the all monomers.

17. The method of claim 1, wherein the second liquid contains all amount of the second monomer for manufacturing the polymer.

18. The method of claim 1, wherein an amount of the radical polymerization initiator contained in the third liquid is in the range from 1 wt % to 50 wt %.

19. The method of claim 13,
    wherein the first monomer has the lowest polymerizablity among all monomers.

* * * * *